United States Patent
Sadjadi et al.

[11] Patent Number: 5,427,967
[45] Date of Patent: Jun. 27, 1995

[54] TECHNIQUE FOR MAKING MEMORY CELLS IN A WAY WHICH SUPPRESSES ELECTRICALLY CONDUCTIVE STRINGERS

[75] Inventors: S. M. Reza Sadjadi, San Jose; Jeffrey R. Perry, Sunnyvale, both of Calif.

[73] Assignee: National Semiconductor Corporation, Santa Clara, Calif.

[21] Appl. No.: 31,373

[22] Filed: Mar. 11, 1993

[51] Int. Cl.$^6$ .............................................. H01L 21/70
[52] U.S. Cl. ........................................ 437/43; 437/48; 437/52; 437/233; 437/235
[58] Field of Search ................ 437/43, 48, 52, 233, 437/241, 235, 228; 156/643

[56] References Cited

U.S. PATENT DOCUMENTS

| | | | |
|---|---|---|---|
| 4,151,021 | 4/1979 | McElroy | 437/43 |
| 4,462,846 | 7/1984 | Varshney | 437/69 |
| 4,849,369 | 7/1989 | Jeuch et al. | 437/43 |
| 5,019,879 | 5/1991 | Chiu | 437/43 |
| 5,081,056 | 1/1992 | Mazzali et al. | 437/43 |

FOREIGN PATENT DOCUMENTS

| | | |
|---|---|---|
| 0123726A2 | 11/1984 | European Pat. Off. |
| 0258141A1 | 3/1988 | European Pat. Off. |
| 0308316 | 3/1989 | European Pat. Off. |
| 0372614A1 | 6/1990 | European Pat. Off. |
| 0499985A2 | 8/1992 | European Pat. Off. |
| 0509697A2 | 10/1992 | European Pat. Off. |
| 0080170 | 7/1981 | Japan . |
| 04217373 | 8/1992 | Japan . |
| 05090598 | 4/1993 | Japan . |

*Primary Examiner*—Tom Thomas
*Attorney, Agent, or Firm*—Hickman & Beyer

[57] ABSTRACT

There is disclosed herein a technique for manufacturing a group of memory cells or devices on a common oxide coated silicon substrate such that the cells are arranged in rows and columns with row and column spaces separating the individual cells from one another. Each of the cells includes an array of different layers on the oxide coated top surface of the substrate including, in particular, the polysilicon layer. As disclosed, a method is provided for preventing the formation of polysilicon stringers between individual cells during their manufacture. This method is carried out by first forming the columns before the rows are formed such that continuous sidewalls of the columns are exposed to the ambient surroundings. Thereafter, these sidewalls are coated with protective layers, specifically layers of nitride.

11 Claims, 3 Drawing Sheets

TECHNIQUE FOR MAKING MEMORY CELLS IN A WAY WHICH SUPPRESSES ELECTRICALLY CONDUCTIVE STRINGERS

TECHNICAL FIELD

The present invention relates generally to memory cells such as EPROMs and their method of manufacture, and more particularly to a specific method of making memory cells in a way which suppresses the formation of polysilicon or other such electrically conductive stringers.

BACKGROUND

EPROM and like memory devices or cells and various methods of manufacturing these devices are well known in the art. An example of one such prior art EPROM device is illustrated in FIG. 1 and generally designated by the reference numeral 10. As depicted in FIG. 1, this device includes a silicon substrate 12 having implanted therein, among other components, a source S and a drain D on opposite sides of a channel C which, along with the source and drain and other components, form a transistor region of the EPROM device. A gate dielectric, typically silicon dioxide 14, which will be referred to merely as an oxide, coats the top surface of silicon substrate 12 and serves to support an array of different layers directly over the channel C, as illustrated in FIG. 1. This array of different layers includes a lowermost electrically conductive layer 16, which is typically doped polycrystalline silicon (polysilicon) or amorphous silicon, hereinafter referred to as poly I, which serves as a floating gate, two additional oxide layers 18 and 20 with a nitride layer 22 therebetween (ONO layers), and finally an uppermost electrically conductive layer such as doped polycrystalline silicon (polysilicon) or amorphous silicon layer 24, hereinafter referred to as poly II, which serves as a control gate. While not shown, a layer of silicide such as tungsten silicide may be provided on top of the poly II layer. The ONO layers serve to insulate the poly I and II layers from one another. This insulating multilayer may be comprised of materials other than ONO such as tantalum pentoxide.

The EPROM device shown in FIG. 1 is but one of a relatively large number of such devices which together form an arrangement 26 of such devices sharing a common oxide covered or coated silicon substrate, that is, a silicon substrate having, among other layers shown, an oxide layer grown on its top surface, as illustrated in FIG. 2. As seen there, four such devices 10 are depicted on common oxide coated substrate 12. While not shown in FIG. 2, each of these devices is comprised of its own transistor region including a source, drain and channel and its own associated array of different layers including a poly I layer, a poly II layer and ONO layers therebetween. For purposes of clarity, these various components making up the different EPROM devices are not illustrated in FIG. 2. It should be noted, however, that the various EPROM devices are arranged in rows and columns with row spaces R1, R2 and so on and column spaces C1, C2 and so on separating the individual EPROM devices from one another.

Having described the arrangement 26 of EPROM devices 10 from a structural standpoint, attention is now directed to one way in which the arrangement is produced in accordance with the prior art. To this end, attention is first directed to FIG. 3 which illustrates the overall arrangement of EPROM devices at an intermediate stage in its formation. Specifically, the gate oxide layer 14 has been grown on the top surface of a silicon substrate 12, that is, before the source and drain of each of the transistor regions have been implanted within the substrate. In addition, poly I and ONO layers have been formed over the oxide coated substrate and, by means of conventional lithography, sections of the ONO and poly I layers have been etched away to form a series of columns of different layers with column spaces C1, C2 and so on between opposing sidewalls 28 of adjacent columns. Thus far, no row spaces R1, R2 and so on have been provided and, therefore, each column is continuous along its entire length. At this time, a thin layer of oxide (edge oxide) is grown on bottom segments of the sidewalls 28 over the poly I layer, as indicated at 30 in FIG. 3. Each of these layers is sufficiently thick so as to protect the poly I layer 16 during formation of each source and drain S and D, respectively, which will be discussed immediately below. On the other hand, it is sufficiently thin so as not to penetrate sidewalls 28 to any significant extent. This is important for reasons to become apparent.

Once oxide layer 30 is formed, the source-drain transistor regions associated with the various EPROM devices are established within the substrate, in column spaces C1, C2 and so on by implanting sources S and drains D, thereby forming channel C therebetween, as depicted in FIG. 4. As also seen in this latter figure, thick layers of differential oxide are grown wherever poly I or oxide covered silicon is exposed, specifically along the poly I segments of sidewalls 28 and over the exposed gate oxide layer 14 within column spaces C1, C2, and so on. These differential oxide layers, which are generally indicated at 34 in FIG. 4, are substantially thicker than the relatively thin layers 30 and serve to physically and chemically protect the source and drain region during further processing of the overall arrangement of EPROM devices and specifically during the formation of row spaces R1, R2 and so on.

A serious drawback in the overall formation process described thus far resides in the formation of the relatively thick differential oxide layer 34. In particular, as illustrated in FIG. 4, because of its thickness, the differential oxide has been found to penetrate significantly into the sidewalls 28 of the continuous columns at the tops of their respective poly I layers, thereby forming what may be referred to as overhanging wedges 35. At the same time, the differential oxide tends to recess inward creating shadowed areas 35a. The significance of these wedges and shadowed areas will become apparent below. For the moment, it suffices to say that after formation of protective differential oxide layer 34, poly II layer 24 is formed over the uppermost oxide layers of and in the spaces between each column, as illustrated in FIG. 5. Thereafter, by means of conventional lithography, sections of the continuous columns are removed from the oxide coated top surface of the silicon substrate so as to form row spaces R1, R2 and so on, thereby separating the continuous columns into individual EPROM devices, as illustrated in FIG. 2. Of particular interest is the way in which the poly I and poly II layers are removed. In accordance with conventional practice, it is preferably done so by means of vertical etching. However, note specifically from FIG. 6 that, as a result of this vertical etching process, the shaded portions of poly I material, that is, those portions under overhanging wedges 35 of differential oxide and the shaded portions of poly II material, that is, those portions within recesses 35a, are not removed. These unremoved poly I and poly II segments (or other such electrically conductive material that might be used) tend to form electrically conductive stringers across row spaces R1, R2 and so on between adjacent EPROM devices in the various columns. These poly stringers, which are generally indicated at 40 and 41 by dotted lines in FIG. 2, if left in place, will short the EPROM devices together making the devices inoperative.

As will be described in more detail hereinafter, a method is provided in accordance with the present invention for producing EPROM devices (and memory cells generally) in a way which does not result in the creation of poly or other such electrically conductive stringers. More specifically, as will be seen, in the case of an EPROM device of the type described above, before thick differential oxide layer 34 is applied (see FIG. 4), the sidewalls 28, particularly across the poly I layers, are treated in a way which prevents the differential oxide from penetrating the sidewalls and from forming outer recesses during its formation over the transistor regions. This, in turn, eliminates the formation of inwardly projecting wedges 35 of differential oxide extending over the top of the poly I layer and shadowed areas 35a which, in turn, eliminate the formation of poly stringers as a result of the vertical etching of the poly I and poly II layers. In a preferred embodiment of the present invention, as will be seen, each of the sidewalls 28 is treated, actually coated, with a layer of nitride before the differential oxide is grown.

DESCRIPTION OF THE DRAWINGS

The present invention will be described in more detail hereinafter in conjunction with the drawings, wherein.

DESCRIPTION OF THE PREFERRED EMBODIMENT

Figure 1:
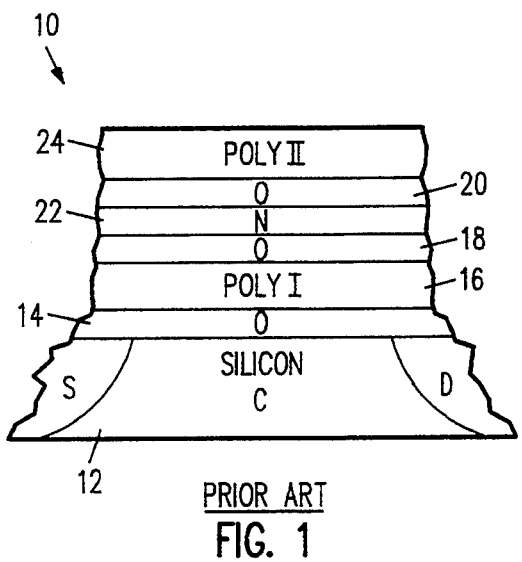
FIG. 1 is a diagrammatic illustration, shown in side elevation, of a partially formed memory cell (with certain components omitted for purpose of clarity), specifically an EPROM device, formed in accordance with the prior art.
Figure 2:
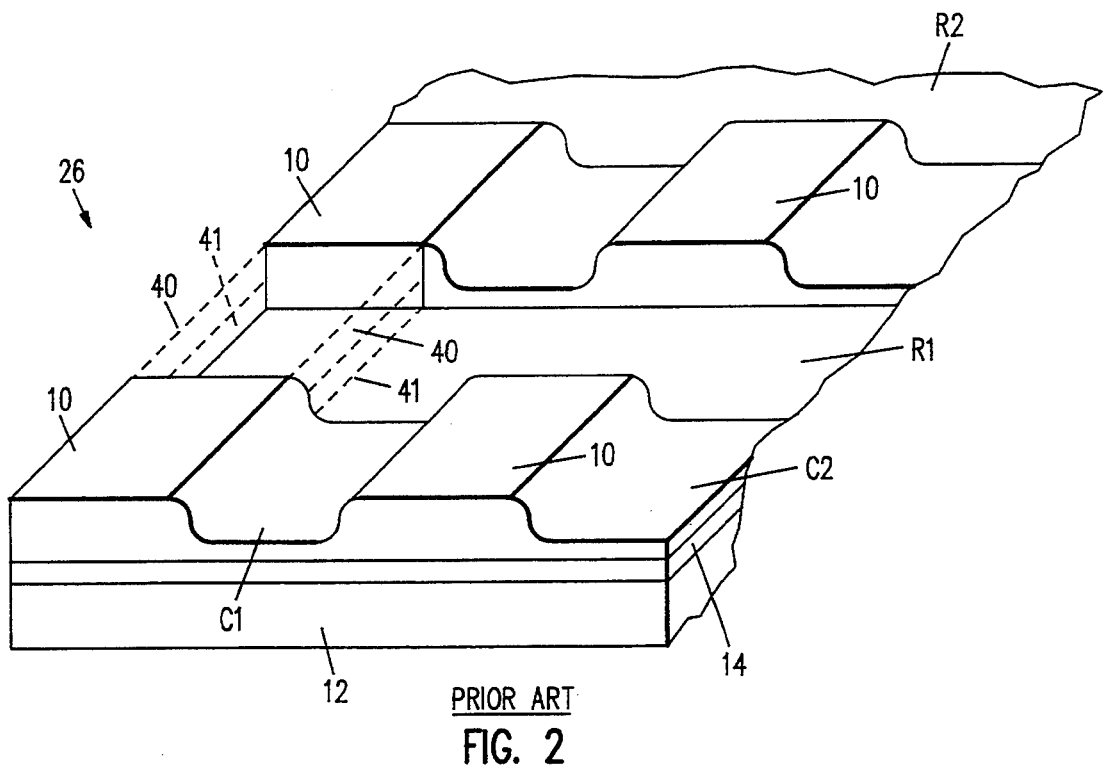
FIG. 2 is a diagrammatic illustration, shown in partially broken away prospective view, of an overall arrangement of EPROM devices.
Figure 3:
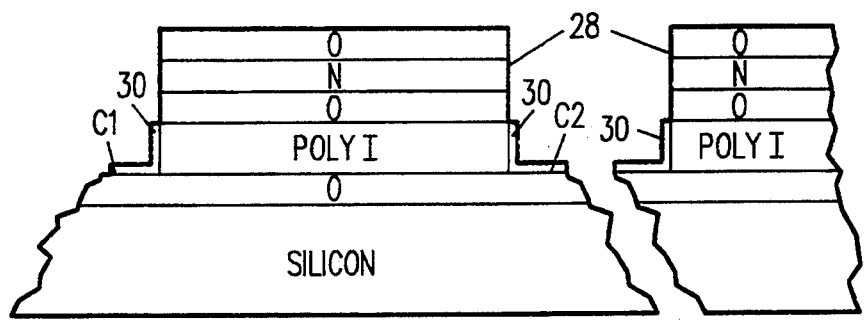
FIGS. 3–6 are diagrammatic illustrations, shown in side elevation, depicting successive steps in the formation of the EPROM device depicted in FIG. 1.
Figure 4:
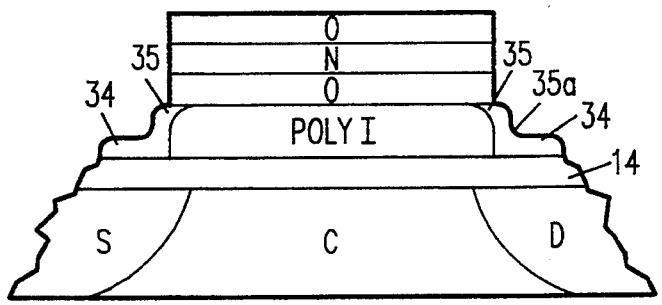
Figure 5:
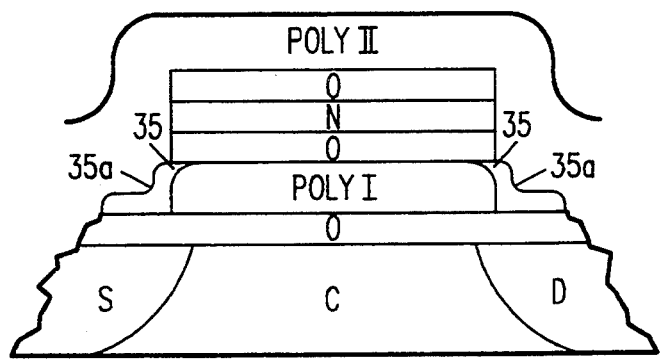
Figure 6:
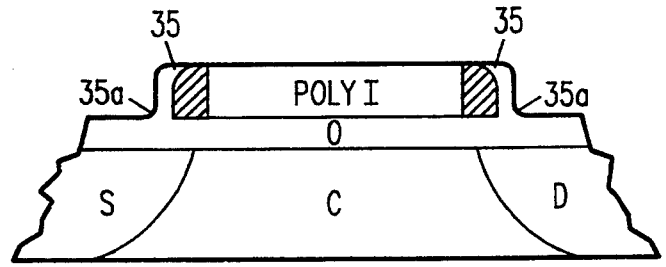
Figure 7:
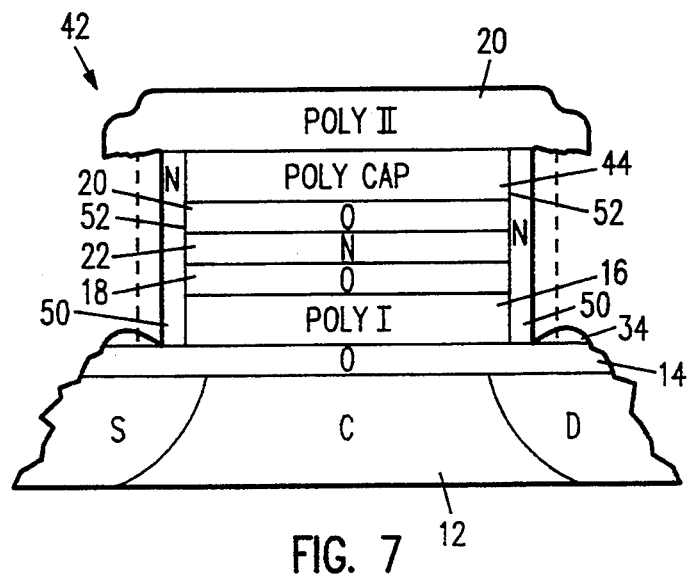
FIG. 7 is a diagrammatic illustration, shown in side elevation, of a memory cell, specifically an EPROM device, designed and formed in accordance with the present invention.

Having discussed FIGS. 1–6 previously, attention is immediately directed to FIG. 7 which, as stated above, diagrammatically illustrates an EPROM device designed and formed in accordance with the present invention. This device, which is generally indicated by the referenced numeral 42, includes many of the same components as previously described device 10 and is formed by carrying out many of the same steps. Specifically, as in the case of device 10, device 42 is one of a number of such devices arranged on a common oxide coated silicon substrate in rows and columns, in the same manner as arrangement 26 shown in FIG. 2. Thus, device 42 begins with the same silicon substrate 12 and oxide layer 14 illustrated in FIG. 3. In fact, device 42 also includes the same poly I layer 16 and the same successive ONO layers 18, 22, and 20, respectively, as depicted in FIG. 3. In addition, for the reasons to be discussed hereinafter, an additional polysilicon or polycap layer 44 is provided over the ONO layers as illustrated in FIG. 7 and a further layer of nitride 46 is formed over the polycap layer (shown in FIG. 8). Nitride layer 46 is subsequently removed and an uppermost poly II layer corresponding to the poly II layer 20 forming part of device 10 is located over the polycap layer.

Still referring to FIG. 7, the EPROM device 42 has been described thus far as being identical to the device 10, except for the polycap layer 44 and its associated nitride layer 46. EPROM device 42 differs from EPROM device 10 in a more significant way. As can be seen in FIG. 7, device 42 includes vertically extending layers 50 of nitride extending from the oxide coated top surface of silicon substrate 12 upward on sidewalls 52 defined by the successive layers 16, 18, 22, 20, and 44. As will be seen, these nitride layers, or spacers as they may be called, prevent differential oxide from penetrating the sidewalls 52 during subsequent processing of the device, specifically during the growth of differential oxide 34, thereby eliminating the formation of inwardly projecting wedges 35 of differential oxide corresponding to the previously described wedges 35. These nitride layers also eliminate shadowed areas 35a.

Figure 8:
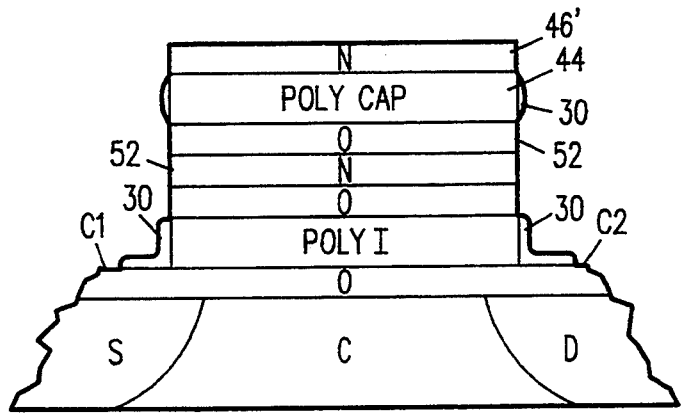
FIGS. 8 and 9 are diagrammatic illustrations, shown in side elevation, depicting some of the steps carried out in forming the device of FIG. 7.

Having described EPROM device 42 from a structural standpoint, attention is now directed to the way in which an arrangement of such devices is formed in accordance with the present invention. At the outset, it should be noted that the initial formation of the arrangement of devices 42 proceeds in the same manner as arrangement 26 to the extent illustrated in FIG. 3, except that polycap layers 44 and their associated nitride layers 46' are formed over the ONO layers several steps before protective oxide layers 30 are grown, as illustrated in FIG. 8. In this regard, note that the oxide layers 30 not only form on the sides of the poly I layer but also the sides of the polycap layer 44. After formation of these various layers, each device 42 is provided with its own transistor region consisting of a source and drain on opposite sides of a channel. Thus, FIG. 8 depicts one of the many devices 42 at this point in its formation. As such, partially formed device 42 includes an oxide coated silicon substrate having a source-drain region implanted therein and supporting, successively, poly I layer 16, ONO layers 18, 22 and 20, respectively, polycap layer 44 and nitride layer 46. These latter layers define previously recited sidewalls 52 which are in part coated with protective oxide layers 30. In this latter regard, it should be noted that the oxide layers 30 do not tend to coat the sidewall nitride sections defined in the ONO layers. This is because the oxide grows slowly over the nitride, as is well known. The spaces on either side of the particular EPROM device illustrated in FIG. 8 correspond to column spaces C1 and C2.

Figure 9:
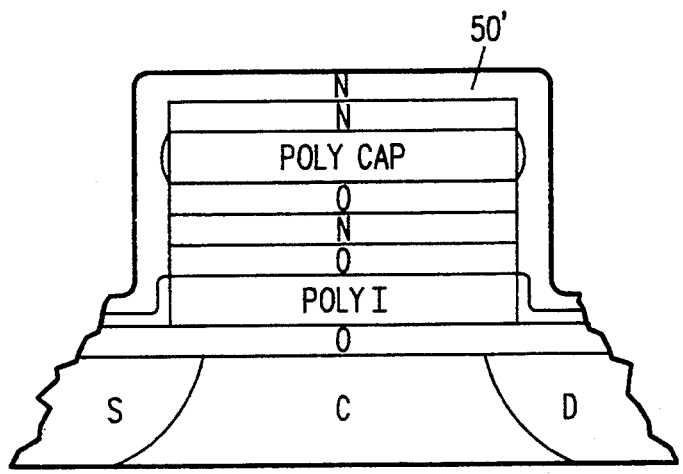

With the EPROM device 42 in its partially formed condition illustrated in FIG. 8, the next step in its formation process is to deposit a blanket layer 50' of nitride over the entire arrangement, that is, over the top of each of the partially formed devices, over each of their sidewalls and within the column spaces, as illustrated in FIG. 9. Thereafter, by means of vertical etching, all of the horizontal segments of this layer of nitride are removed, thereby leaving only the previously described vertically extending layers 50 shown in FIG. 7. Thus, the horizontally extending layers over nitride layers 46 and the horizontally extending layers within channel spaces C1, C2 and so on are eliminated. In this regard, polycap layer 44 and its associated nitride layer, 46 serve to protect the ONO layers from the blanket layer 50' of nitride. Otherwise, it would be difficult to remove this latter nitride layer from the oxide layer 20.

After eliminating all of the nitride layer 50', with the exception of vertical nitride spacers 50, a differential oxide layer corresponding to previously described layer 34 is grown within the column spaces C1, C2 and so on, after which the nitride layer 46 is removed. Thereafter, poly II layer 20 is provided and row spaces R1, R2 and so on are formed in the same manner described previously. However, in the case of EPROM devices 42, in accordance with the present invention, vertical nitride spacers 50 prevent the differential oxide from forming wedges 35 and shadowed areas 35a. Thus, during formation of the row spaces, no poly stringers 40 or 41 are created.

Having now described EPROM device 42 and the way in which it is formed in accordance with the present invention, it is to be understood that the utilization of the nitride spacers to prevent the formation of poly stringers is not limited to EPROM devices, but rather any types of memory devices which, in the absence of nitride spacers, would or could include polysilicon, amorphous silicon or any other such electrically conductive stringers. Moreover, because the nitride spacers are formed before the transistor region is provided, the nitride spacers may be used in lieu of oxide layers 30 to protect the poly I layers during formation of the transistor region. Thus, the process may or may not include oxide layers 30. It is also to be understood that the present invention does not reside in any particular formation step per se. That is, each and every step required to actually form device 42 and, for that matter, device 10, as described previously, is well known in the art. As a result, detailed descriptions of the forming steps have not been provided and, in fact, some steps not relevant to an understanding of the present invention have been omitted but could be readily provided.

What is claimed is:

1. A method of making a group of memory cells on a silicon substrate having an oxide coated top surface, said cells being arranged in rows and columns with row and column spaces separating the individual cells from one another, said method comprising the steps of:
    a) forming a plurality of successive layers of specific material on the oxide coated top surface of said silicon substrate, said layers of specific material including a floating gate conductive layer, a control gate conductive layer, and a dielectric layer therebetween;
    b) removing sections of said layers from said substrate in order to form said column spaces, and such that the remaining portions of said layers form a series of columns having opposite sidewalls, said sidewalls including a respective portion of each of said successive layers of material;
    c) establishing within said substrate, in said column spaces, a source-drain transistor region for each of said memory cells;
    d) forming protective layers of oxide on the oxide coated top surface of said silicon substrate, within said column spaces and directly over said transistor regions, said protective layers of oxide serving to protect said transistor regions against physical and/or chemical attack during subsequent processing of the memory cells;
    e) after establishing said transistor regions and before forming said protective layers of oxide, forming a protective layer of material on said sidewalls of said series of columns in a way which prevents the protective oxide from penetrating said sidewalls during its formation over said transistor regions; and
    f) after establishing said transistor regions and forming said protective oxide layers, removing additional sections of said plurality of successively formed layers of material from the oxide coated top surface of said silicon substrate so as to form said row spaces, whereby said column spaces and said row spaces separate said individual cells and said individual cells include the remaining portions of said plurality of successively formed layers of material.

2. A method according to claim 1 wherein said step of forming a protective layer of material on said sidewalls of said series of columns includes forming protective layers of nitride on at least certain sections of said sidewalls.

3. A method according to claim 2 wherein one of said layers of said plurality of successively formed layers is a poly I layer which, when divided said column spaces and said row spaces, serves as individual floating gates for said cells, said nitride layers serving to prevent said protective oxide from penetrating said plurality of layers and thereby preventing the subsequent formation of poly I stringers during and as a result of formation of said series of row spaces.

4. A method according to claim 3 including the step of forming a relatively thin layer of oxide over at least the poly I sections of said sidewalls of said series of columns prior to establishing said transistor regions in order to protect said poly I layer during the formation of said transistor regions.

5. A method according to claim 3 wherein said nitride layers are formed on the entire sidewalls of said series of columns including said polysilicon layer.

6. A method according to claim 5 wherein said polysilicon layer forming part of said plurality of successively formed layers is located directly above and on the oxide coated surface of said silicon substrate and wherein said plurality of layers includes as additional layers, in successive order above said polysilicon layer; an oxide layer, a nitride layer, a further oxide layer, a polysilicon cap layer and a further nitride layer.

7. A method according to claim 6 including the step of forming a poly II layer on top of said plurality of layers after establishing said transistor region and forming said protective oxide layers.

8. A method according to claim 1 wherein said memory cells are EPROMs.

9. A method of making a memory cell, comprising the steps of:
    a) providing a silicon substrate having an oxide coated top surface and establishing within said substrate a transistor region including a source, a drain and a channel therebetween;
    b) forming a plurality of successive layers of material including a floating gate conductive layer, a control gate conductive layer, and a dielectric layer therebetween on the oxide coated top surface of said silicon substrate, said layers including sidewalls extending up from said oxide coated substrate immediately above said channel and between said source and drain;

c) forming a layer of nitride on the sidewalls of said layers, protecting said sidewalls from oxidation during subsequent steps;

d) forming a protective layer of oxide on the oxide coated top surface of said silicon substrate immediately over said source and drain after forming said layer of nitride on the sidewalls of said layers; and e) thereafter etching said plurality of successive layers further defining said memory cell.

10. A method according to claim 9 wherein said plurality of successive layers of material includes a lowermost layer of poly I.

11. A method according to claim 10 wherein said plurality of successive layers of material has a rectangular cross-section so as to include first and second pairs of opposite sidewalls and wherein each of said first sidewalls is entirely covered with a layer of nitride.

* * * * *

UNITED STATES PATENT AND TRADEMARK OFFICE
CERTIFICATE OF CORRECTION

PATENT NO. : 5,427,967
DATED : June 27, 1995
INVENTOR(S) : Sadjadi et al.

It is certified that error appears in the above-indentified patent and that said Letters Patent is hereby corrected as shown below:

Column 1, line 41, change "Iand II" to --I and II--
Column 2, line 6, change "Iand" to --I and--
Column 2, line 16, insert a space after --(edge oxide)--
Column 2, line 63, change "Iand" to --I and--

CLAIMS:

Column 6, line 30, after "divided" insert --by--

Signed and Sealed this

Thirtieth Day of April, 1996

Attest:

BRUCE LEHMAN

Attesting Officer    Commissioner of Patents and Trademarks